(12) United States Patent
Yun et al.

(10) Patent No.: US 11,073,870 B2
(45) Date of Patent: Jul. 27, 2021

(54) DISPLAY DEVICE

(71) Applicant: LG Display Co., Ltd., Seoul (KR)

(72) Inventors: Young-Joon Yun, Paju-si (KR); Seung-O Jeon, Seoul (KR); Shin-Suk Lee, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 104 days.

(21) Appl. No.: 16/582,714

(22) Filed: Sep. 25, 2019

(65) Prior Publication Data
US 2020/0163239 A1    May 21, 2020

(30) Foreign Application Priority Data

Nov. 19, 2018  (KR) .......................... 10-2018-0142473

(51) Int. Cl.
| | | |
|---|---|---|
| *G06F 1/16* | (2006.01) | |
| *H05K 5/02* | (2006.01) | |
| *H05K 5/00* | (2006.01) | |
| *E05D 3/06* | (2006.01) | |
| *E05D 7/00* | (2006.01) | |

(52) U.S. Cl.
CPC .......... *G06F 1/1681* (2013.01); *G06F 1/1652* (2013.01); *H05K 5/0226* (2013.01); *E05D 3/06* (2013.01); *E05D 7/00* (2013.01); *E05Y 2900/606* (2013.01); *H05K 5/0017* (2013.01)

(58) Field of Classification Search
CPC .... H05K 5/0226; G06F 1/1652; G06F 1/1681
See application file for complete search history.

(56) References Cited

U.S. PATENT DOCUMENTS

| | | | |
|---|---|---|---|
| 8,804,349 B2 | 8/2014 | Lee et al. | |
| 9,173,288 B1* | 10/2015 | Kim | ...................... G06F 1/1679 |
| 9,250,733 B2* | 2/2016 | Lee | ...................... H04M 1/022 |

(Continued)

FOREIGN PATENT DOCUMENTS

| | | |
|---|---|---|
| CN | 103778858 A | 5/2014 |
| CN | 106255935 A | 12/2016 |

(Continued)

OTHER PUBLICATIONS

European Patent Office, Extended European Search Report, EP Patent Application No. 19205580.4, dated Apr. 22, 2020, seven pages.

(Continued)

*Primary Examiner* — Nidhi Thaker
(74) *Attorney, Agent, or Firm* — Fenwick & West LLP

(57) ABSTRACT

Disclosed is a display device including first and second frames arranged adjacent to each other, a panel arranged on inner surfaces of the first and second frames, and a folding hinge unit configured to enable the first and second frames to be folded, and connected to the first and second frames. The folding hinge unit includes a pair of panel support plates configured to support the panel so that a position of the panel is changed, and spaced apart from each other, first and second hinge links arranged under the panel support plates and coupled to each other to be movable about a central axis of folding, and a pair of hinge brackets configured to support the panel support plates and the first and second hinge links to be movable, and respectively connected to the first frame and the second frame.

15 Claims, 8 Drawing Sheets

(56) References Cited

U.S. PATENT DOCUMENTS

| | | | |
|---|---|---|---|
| 9,600,035 B2* | 3/2017 | Park | G06F 1/1652 |
| 9,603,271 B2* | 3/2017 | Lee | H04M 1/0268 |
| 9,786,207 B2 | 10/2017 | Kim et al. | |
| 9,798,359 B2* | 10/2017 | Seo | G06F 1/1681 |
| 10,032,391 B2 | 7/2018 | Kim et al. | |
| 10,503,210 B2 | 12/2019 | Lee et al. | |
| 2011/0063783 A1* | 3/2011 | Shim | G06F 1/1681 |
| | | | 361/679.01 |
| 2014/0111954 A1 | 4/2014 | Lee et al. | |
| 2017/0061836 A1 | 3/2017 | Kim et al. | |
| 2017/0115701 A1* | 4/2017 | Bae | G06F 1/16 |
| 2017/0365197 A1 | 12/2017 | Kim et al. | |
| 2018/0150107 A1 | 5/2018 | Lee et al. | |
| 2018/0210513 A1* | 7/2018 | Lin | G06F 1/1681 |
| 2018/0242466 A1 | 8/2018 | Lee et al. | |
| 2018/0329460 A1 | 11/2018 | Song | |
| 2020/0310497 A1* | 10/2020 | Hsu | E05D 3/18 |
| 2020/0355216 A1* | 11/2020 | Bae | G06F 1/1616 |

FOREIGN PATENT DOCUMENTS

| | | |
|---|---|---|
| CN | 106486018 A | 3/2017 |
| CN | 106601130 A | 4/2017 |
| CN | 107077172 A | 8/2017 |
| CN | 108122492 A | 6/2018 |
| CN | 108648629 A | 10/2018 |
| EP | 2 696 257 A2 | 2/2014 |
| KR | 10-2018-0076271 A | 7/2018 |

OTHER PUBLICATIONS

China National Intellectual Property Administrative, Office Action, CN Patent Application No. 201910977199.6, dated Jun. 3, 2021, 14 pages.

* cited by examiner

DISPLAY DEVICE

CROSS-REFERENCE TO RELATED APPLICATIONS

This application claims the benefit of Republic of Korea Patent Application No. 10-2018-0142473, filed on Nov. 19, 2018, which is hereby incorporated by reference in its entirety.

BACKGROUND OF THE DISCLOSURE

Technical Field

The present disclosure relates to a display device, and more particularly, to a foldable display device.

Background

Recently, in information-oriented society, importance of display devices as a visual information transfer medium has been emphasized and, in order to occupy a main position in the future, display devices should satisfy requirements, such as low power consumption, thinness, light-weight, high definition, etc.

Displays are divided into an emissive type which autonomously emits light, such as a cathode ray tube (CRT), an electroluminescent (EL) element, a light emitting diode (LED), a vacuum fluorescent display (VFD), a field emission display (FED), a plasma display panel (PDP) and an organic light emitting diode (OLED), and a non-emissive type which cannot autonomously emit light, such as a liquid crystal display (LCD).

As technology has advanced, a flexible display device, which is manufactured using a flexible material, such as plastic, instead of an inflexible glass substrate applied to conventional displays, and thus maintains display performance thereof even if bent like paper, rapidly rises as a next generation display device.

Flexible display devices using a plastic thin film transistor substrate rather than glass may be divided into an unbreakable type which has high durability, a bendable type which is bendable without cracking, a rollable type which is rolled up, and a foldable type, etc. These flexible display devices may have space utilization and advantages in interior design, and be applied to various fields.

Particularly, in order to implement a large scale together with ultra-thinness, light-weight and miniaturization, research on a foldable display device which is portable in a folded state and displays an image in an unfolded state is being vigorously carried out.

The foldable display device may be applied to various fields, such as not only mobile devices including a mobile phone, an ultra-mobile PC, an e-book and e-paper, but also a TV, a monitor, etc.

The foldable display device includes a hinge mechanism which enables the foldable display device to be folded and unfolded.

Here, hinge mechanisms which are generally used are implemented using multi-link hinges having various structures including a chain or two-axis folding hinges including two hinge axes and interconnected by a central body.

However, these hinge mechanisms may cause poor durability to external load due to incomplete closing of a folding section thereof, or increase in a bezel to secure an inner space, in which a panel may be bent, in a folded state.

SUMMARY

Accordingly, the present disclosure is directed to a display device that substantially obviates one or more problems due to limitations and disadvantages of the related art.

An object of the present disclosure is to provide a display device having a solid structure which is smoothly foldable and in which a folding section is completely closed to secure sufficient durability to external load, and securing a sufficient space, in which a panel may be bent, to reduce a bezel.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, a display device includes first and second frames arranged adjacent to each other, a panel arranged on inner surfaces of the first and second frames, and a folding hinge unit configured to enable the first and second frames to be folded, and connected to the first and second frames, wherein the folding hinge unit includes a pair of panel support plates configured to support the panel so as to enable a position of the panel to be changed, and spaced apart from each other, first and second hinge links arranged under the panel support plates and coupled to each other to be movable about a central axis of folding, and a pair of hinge brackets configured to support the panel support plates and the first and second hinge links to be movable, and respectively connected to the first frame and the second frame.

The panel support plates may include pin insertion holes formed at both side surfaces of the panel support plates in a longitudinal direction, and the folding hinge unit may further include support plate rotating pins inserted into the pin insertion holes to movably couple the panel support plates to the hinge brackets.

Each of the pin insertion holes may be located at one side edge region of each of the side surfaces of the panel support plates so that the panel support plates are capable of being eccentrically rotated.

The hinge brackets may include rotating pin mount holes to receive the support plate rotating pins inserted thereinto.

The first hinge link may include a longitudinal member having a long bar shape extending in a longitudinal direction, and a pair of transverse members extending from both ends of the longitudinal member in a transverse direction.

The first hinge link may further include a pair of first slot pins protruding from both ends of the longitudinal member, a pair of first connection pin insertion holes formed in the transverse members, and a pair of first hinge shaft insertion holes located at ends of the transverse members.

The first hinge link may further include first sliding protrusions provided in the longitudinal direction of the longitudinal member and having a sloped shape.

The second hinge link may have a long plate shape extending in the longitudinal direction.

The second hinge link may include a pair of second slot pins protruding from outer ends of both side surface parts of the second hinge link, a pair of second connection pin insertion holes formed on the side surface parts of the second hinge link and configured to communicate with the first connection pin insertion holes, and a pair of second hinge shaft insertion holes located at inner ends of the side surface parts of the second hinge links.

The second hinge link may further include second sliding protrusions provided in the longitudinal direction and having a sloped shape.

The folding hinge unit may further include a pair of link connection pins inserted into the first and second connection pin insertion holes to form the central axis of folding, and configured to rotatably couple the first and second hinge links to each other.

The hinge brackets may include a pair of rotating pin mount holes configured to receive the support plate rotating pins, a pair of slot pin guides configured to receive the first and second slot pins inserted thereinto so as to be movable, and a pair of hinge shaft fixing holes configured to communicate with the first and second hinge shaft insertion holes.

The folding hinge unit may further include a pair of hinge shafts coupled to the first and second hinge shaft insertion holes and the hinge shaft fixing holes.

The slot pin guides may have a long hole shape to which the first slot pin and the second slot pins are movably connected.

The hinge brackets may further include coupling holes coupled to the first frame and the second frame.

The folding hinge unit may further include a cover member configured to cover the first hinge link and the second hinge link.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
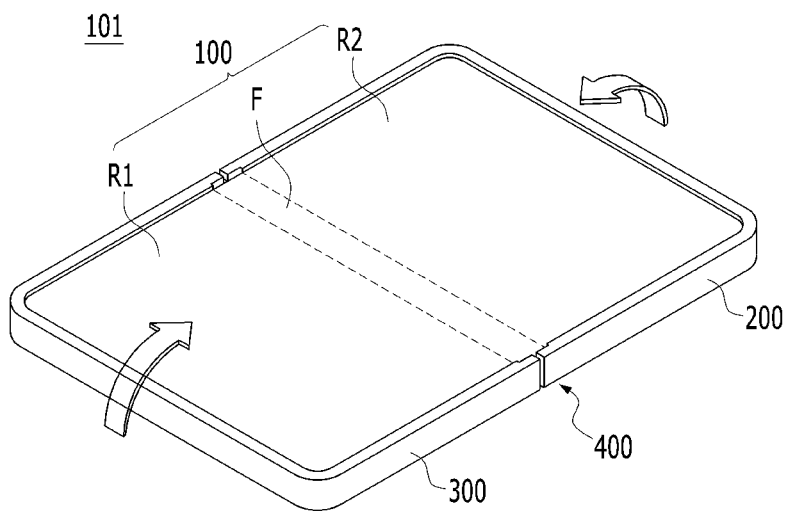
FIG. 1 is a perspective view of a display device in accordance with one embodiment of the present disclosure.

Reference will now be made in detail to the embodiments of the present disclosure, examples of which are illustrated in the accompanying drawings. In the following description of the embodiments, it will be understood that, when a part, such as a layer (film), a region, a pattern or a structure, is said to be "on" or "under" another part, such as a substrate, another layer (film), a region, a pad or a pattern, the part may be located "directly on" or "directly under" the other part or other parts may be interposed between both parts. In addition, it will be understood that a criteria for the upward direction or the outward direction of each layer is described based on the drawings.

Shapes, sizes, rates, angles, numbers, etc. disclosed in the drawings are exaggerated, omitted or schematically illustrated for convenience and clarity of description. Further, sizes of respective elements do not entirely reflect actual sizes of the elements. In the following description of the embodiments, the same elements are denoted by the same reference numerals even though they are depicted in different drawings. Hereinafter, the embodiments of the present disclosure will be described with reference to the accompanying drawings.

Figure 2:
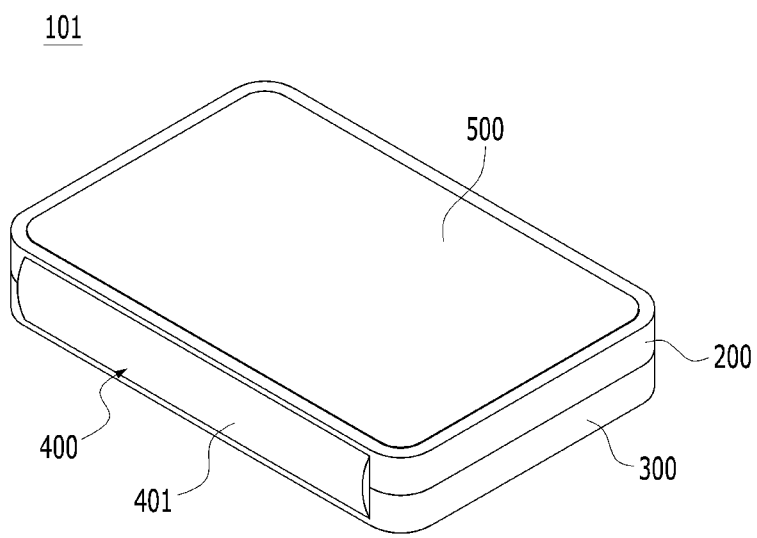
FIG. 2 is a perspective view of the display device of FIG. 1 in a folded state in accordance with one embodiment of the present disclosure.

FIG. 1 is a perspective view of a display device in accordance with one embodiment of the present invention, and FIG. 2 is a perspective view of the display device of FIG. 1 in a folded state.

Referring to FIGS. 1 and 2, a display device 101 in accordance with one embodiment of the present disclosure includes an inner panel 100, a first frame 200, a second frame 300, a folding hinge unit 400, and an outer panel 500.

Here, the panels 100 and 500 may be any one type of flexible organic light emitting display panels, flexible electrophoretic display panels, flexible electrowetting display panels or flexible quantum dot display panels. When the display device 101 is folded, the inner panel 100 may be located on the inner surfaces of the first frame 200 and the second frame 300, and the outer panel 500 may be located on the outer surfaces of the first frame 200 and the second frame 300.

As such, the panels 100 and 500 may be located on both inner and outer surfaces of the first frame 200 and the second frame 300 in the folded state of the display device 101, or one of the inner panel 100 and the outer panel 500 may be provided. Hereinafter, the inner panel 100 and the outer panel 500 will be commonly called "panels".

The panel 100 includes a display area in which an image is displayed by a pixel array including a plurality of pixels. Referring to FIG. 1, the display area of the panel 100 may include a first display area R2 in which the first frame 200 is located, a second display area R1 in which the second frame 300 is located, and a bending area F. That is, the first frame 200 and the second frame 300 are arranged adjacent to each other with the bending area F disposed therebetween.

The first frame 200 may support or receive various parts corresponding to the first display area R2 of the panel 100, and the second frame 300 may support or receive various parts corresponding to the second display area R1 of the panel 100.

Selectively, the first display area R1 and the second display area R2 may have the same size, without being limited thereto. Otherwise, one of the first display area R1 and the second display area R2 may have a greater size. In this case, in the folded state of the panel 100, a part of a display area having a relatively greater size is exposed to the outside, and the exposed part of the display area may continuously display data, time, a remaining battery quantity, notifications, etc., even when the display device 101 is switched off.

The bending area F may be defined as an area located between the first display area R1 and the second display area R2 of the panel 100, and such an area may be variable. That is, the bending area F may be spread into a flat surface state or be bent into a curved surface state to have a constant radius of curvature according to folding. Here, folding may be defined as including a folding operation or an unfolding operation of the bending area F, and be implemented through the folding hinge unit 400.

The folding hinge unit 400 is arranged between the first frame 200 and the second frame 300, and may control bending of the panel 100 while folding the first frame 200 and the second frame 300 so as to be opposite to each other.

Figure 3:
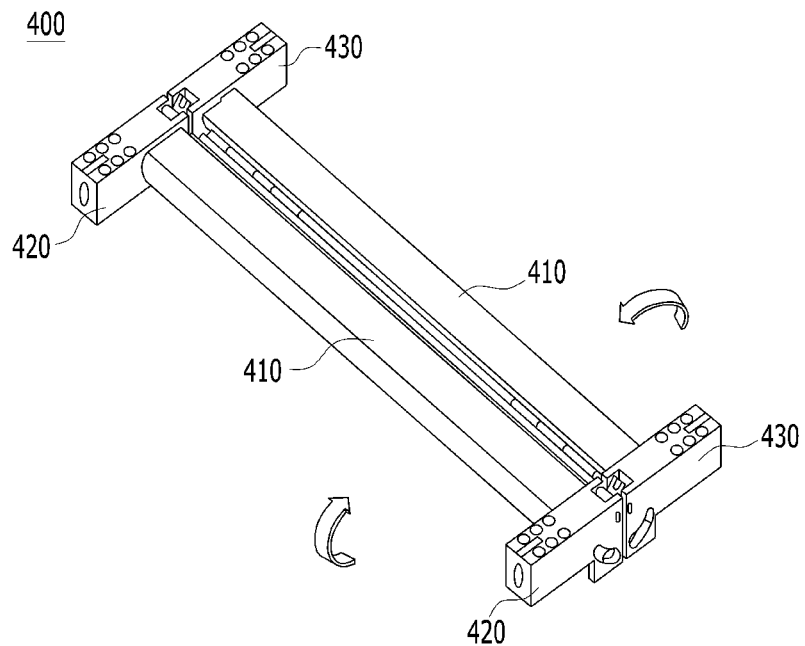
FIG. 3 is a perspective view of a folding hinge unit in accordance with one embodiment of the present disclosure in an unfolded state.
Figure 4:
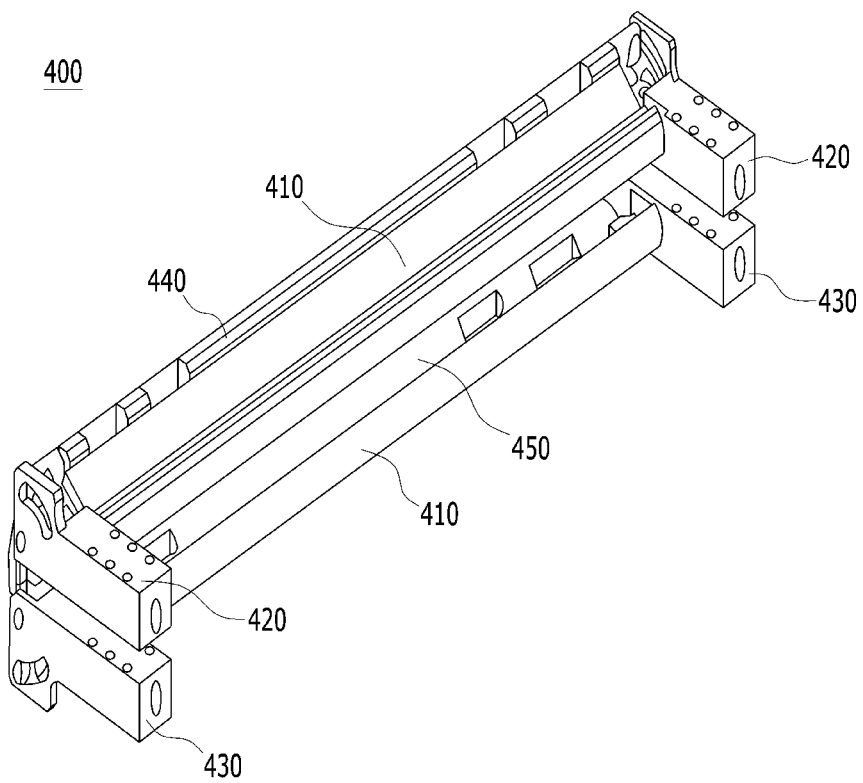
FIG. 4 is a perspective view of the folding hinge unit of FIG. 3 in the folded state in accordance with one embodiment of the present disclosure.
Figure 5:
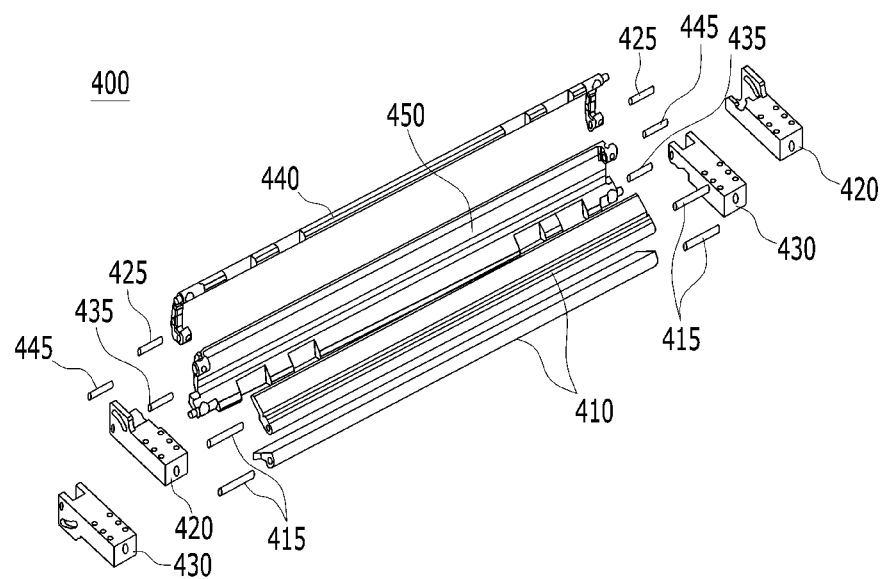
FIG. 5 is an exploded perspective view of the folding hinge unit of FIG. 3 in accordance with one embodiment of the present disclosure.
Figure 6:
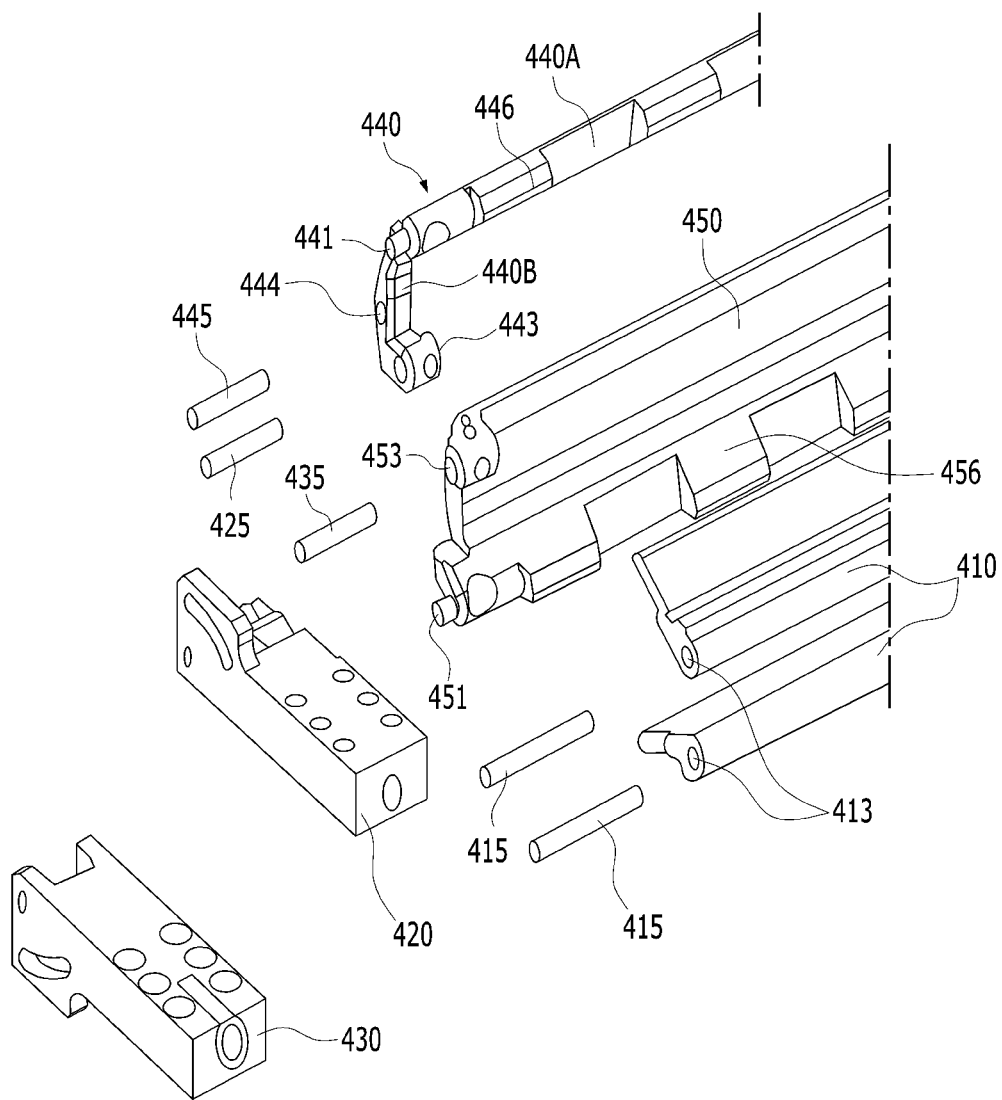
FIG. 6 is a partially enlarged view of FIG. 5 in accordance with one embodiment of the present disclosure.
Figure 7:
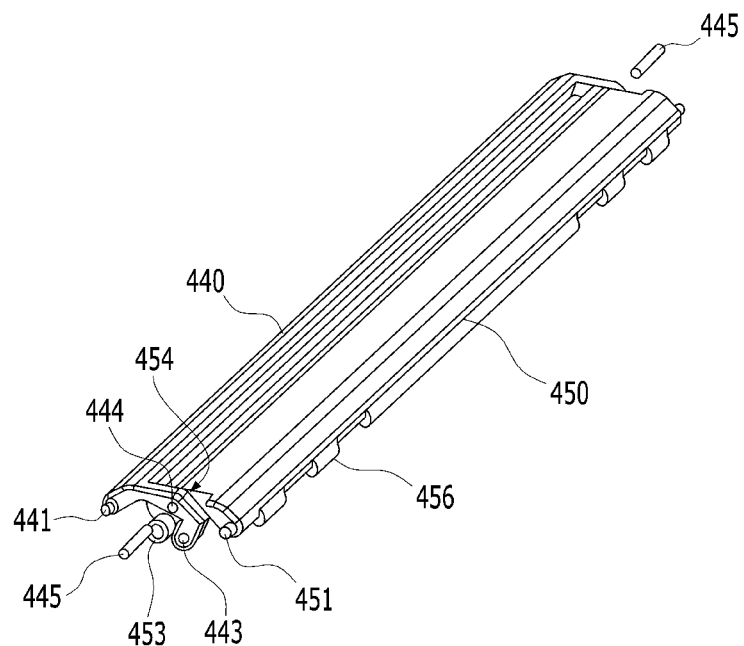
FIG. 7 is a perspective view illustrating a coupling state between a first hinge link and a second hinge link of FIG. 6 in accordance with one embodiment of the present disclosure.
Figure 8:
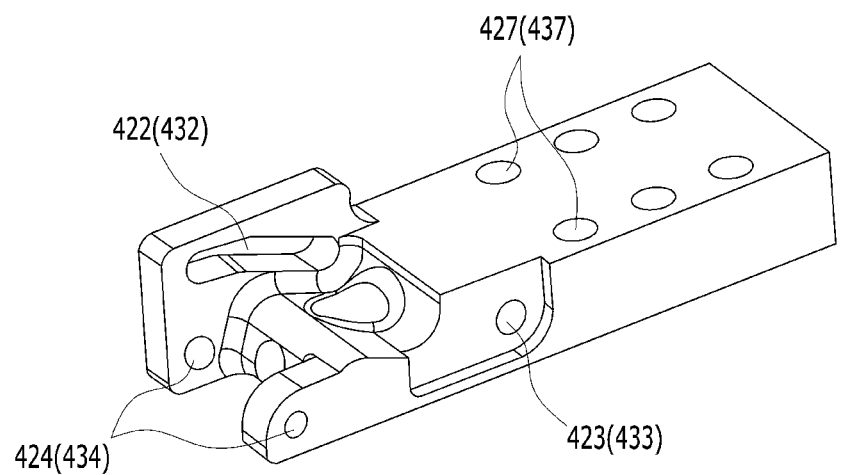
FIG. 8 is an enlarged view of hinge brackets of FIG. 6 in accordance with one embodiment of the present disclosure.
Figure 9A:
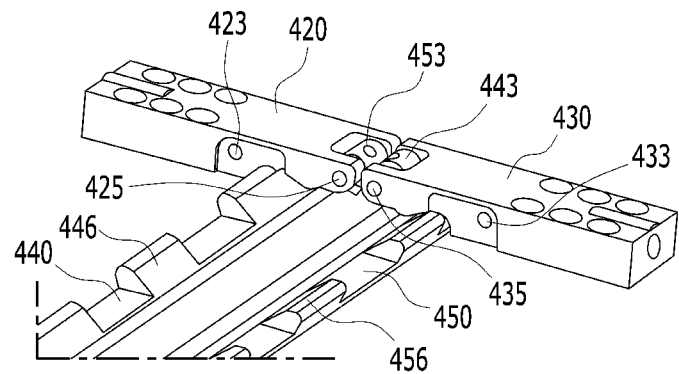
FIGS. 9A and 9B are perspective views illustrating a coupling state among the hinge links, the hinge brackets, and panel support plates of FIG. 6 in accordance with one embodiment of the present disclosure.
Figure 9B:
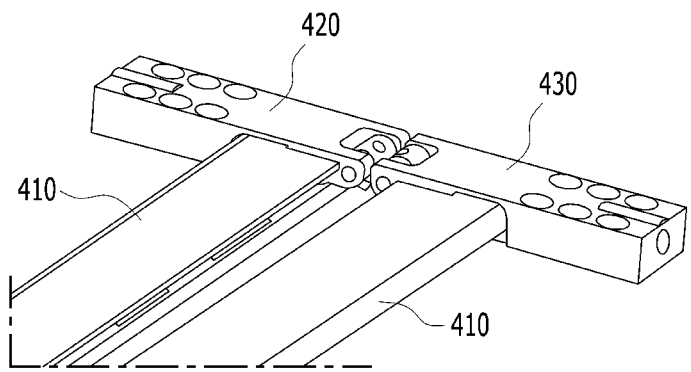

FIG. 3 is a perspective view of a folding hinge unit in accordance with one embodiment of the present disclosure in an unfolded state, FIG. 4 is a perspective view of the folding hinge unit of FIG. 3 in the folded state, FIG. 5 is an exploded perspective view of the folding hinge unit of FIG. 3, FIG. 6 is a partially enlarged view of FIG. 5, FIG. 7 is a perspective view illustrating a coupling state between a first hinge link and a second hinge link of FIG. 6, FIG. 8 is an enlarged view of hinge brackets of FIG. 6, and FIGS. 9A and 9B are perspective views illustrating a coupling state among the hinge links, the hinge brackets and panel support plates of FIG. 6.

Referring to FIGS. 3 to 9B, the folding hinge unit 400 may include a pair of panel support plates 410, a first hinge link 440, a second hinge link 450, and a pair of hinge brackets 420 and 430 respectively arranged at both sides of the panel support plates 410.

The panel support plates 410 may support the panel 100, and be provided in a pair such that the panel support plates 410 are spaced apart from each other. The panel support plates 410 may support the panel 100 so that the position of the panel 100 is changed when the panel 100 is folded. The panel support plates 410 may respectively support the first display area R1 located on the first frame 200 and a part of the bending area F, and the second display area R2 located on the second frame 300 and another part of the bending area F, while changing the same.

For example, in one embodiment, the panel support plates 410 may have a long plate shape having a flat upper surface and extending in a longitudinal direction, and be arranged to face (or referred as adjacent to) each other at the center of the bending area F. Here, the longitudinal direction means a direction extending in parallel to the bending area F, and a transverse direction means a direction perpendicular to the longitudinal direction.

Here, each panel support plate 410 may include pin insertion holes 413 formed at both side surfaces of the panel support plate 410 in a length direction, i.e., in the longitudinal direction, as exemplarily shown in FIG. 6. In other words, an extension direction of the pin insertion hole 413 may be the same as the extension direction of the panel support plate 410. Here, the pin insertion hole 413 may be located at one side edge region of the side surface of the panel support plate 410, i.e., in an eccentric direction. A support plate rotating pin 415 which will be described below is coupled to the pin insertion hole 413 and coupled to a hinge bracket 420 or 430, and thus eccentric rotation of the panel support plate 410 may be performed. The support plate rotating pins 415 may be referred to as flip-flop pins.

The first hinge link 440 and the second hinge link 450 may be arranged under the panel support plates 410, and be coupled to each other so as to be movable about a central axis of folding (with reference to FIGS. 7 and 11). The central axis of folding means a central axis about which the folding operation of the first frame 200 and the second frame 300 is performed so that the bending area F is changed. Connection pin insertion holes 444 and 454 to which the central axis of folding is coupled may be formed in the first hinge link 440 and the second hinge link 450. The central axis of folding may be implemented as link connection pins 445 which will be described below. In other words, the extending direction of the link connection pins 445 may be coincident with the central axis of folding. The link connection pins 445 may be referred to as link pins.

In more detail, as exemplarily shown in FIG. 6, the first hinge link 440 may include a longitudinal member 440A having a long bar shape extending in the longitudinal direction, and transverse members 440B extending from both ends of the longitudinal member 440A in the transverse direction.

A pair of first slot pins 441 protruding outwardly from connection points between the longitudinal member 440A and the transverse members 440B, i.e., from both side surfaces of the longitudinal member 440A, may be located at the first hinge link 440. That is, the first slot pins 441 may be located at the outside of the first hinge link 440.

Further, a plurality of first sliding protrusions 446, which have a sloped shape for sliding movement of the above-described panel support plate 410, may be formed in the length direction on the longitudinal member 440A of the first hinge link 440. The first sliding protrusions 446 may be sloped so that the thickness of the longitudinal member 440A is decreased in the outward direction.

Further, the first hinge link 440 may further include a pair of first connection pin insertion holes 444 formed through the central regions of the transverse members 440B, i.e., the positions of the transverse members 440B forming the central axis of folding, and a pair of first hinge shaft insertion holes 443 located at the ends of the transverse members 440B. First hinge shafts 425 are inserted into the first hinge shaft insertion holes 443, and thus, the first hinge link 440 may be mounted at the hinge brackets 420 so as to be rotatable.

The second hinge link 450 has a long plate shape extending in the longitudinal direction, and is coupled to the first hinge link 440 so as to be movable.

A pair of second slot pins 451 may be located on the outer surfaces of side surface parts of the second hinge link 450. A plurality of second sliding protrusions 456, which has a sloped shape for sliding movement of the above-described panel support plate 410, may be formed in the longitudinal direction on the second hinge link 450. The second sliding protrusions 456 may be sloped so that the thickness of the second hinge link 450 is decreased in the outward direction.

Further, the second hinge link 450 may include a pair of second connection pin insertion holes 454 formed through the central regions of the side surfaces of the second hinge link 450, i.e., the positions of the second hinge link 450 forming the central axis of folding, and a pair of second hinge shaft insertion holes 453 located at the inner regions of both side surfaces of the second hinge link 450. Second hinge shafts 435 are inserted into the second hinge shaft insertion holes 453, and thus, the second hinge link 450 may be mounted at the hinge brackets 420(430) so as to be rotatable.

Here, the folding hinge unit 400 may include a pair of link connection pins 445 inserted into the first connection pin insertion holes 444 and the second connection pin insertion holes 454 and forming the central axis of folding so that the above-described first hinge link 440 and second hinge link 450 are connected so as to be movable.

The link connection pins 445 may have a circular cross-section, be inserted into the first connection pin insertion holes 444 and the second connection pin insertion holes 454 and thus form the central axis of folding. Therefore, the first hinge link 440 and the second hinge link 450 may be coupled to each other by the link connection pins 445 forming the central axis of folding so as to be rotatable. Here, the first hinge link 440 and the second hinge link 450 may be rotatably coupled to each other with a vacant space formed therebetween due to the shape of the first hinge link 440, as exemplarily shown in FIG. 7.

Further, the above-described panel support plates 410 may be arranged on the coupled first hinge link 440 and second hinge link 450, as exemplarily shown in FIGS. 9A and 9B. The panel support plates 410 may respectively contact the above-described first sliding protrusions 446 and second sliding protrusions 456 of the first hinge link 440 and the second hinge link 450.

The hinge brackets 420 and 430 may be provided in a pair so as to movably support a pair of the panel support plates 410 and the first and second hinge links 440 and 450 and to be coupled to the first frame 200 and the second frame 300, respectively.

For this purpose, the hinge brackets 420 and 430 may include rotating pin mount holes 423 and 433, slot pin guides 422 and 432, hinge shaft fixing holes 424 and 434, and coupling holes 427 and 437.

The support plate rotating pins 415 may be inserted into the rotating pin mount holes 423 and 433, thus rotatably supporting the panel support plates 410. As described above, the pin insertion holes 413 are formed on the panel support plates 410, and the support plate rotating pins 415 are respectively inserted into the pin insertion holes 413 and the rotating pin mount holes 423 and 433, thus movably coupling the panel support plates 410 to the hinge brackets 420 and 430.

The first slot pins 441 and the second slot pins 451 respectively protruding from the first hinge link 440 and the second hinge link 450 may be inserted into the slot pin guides 422 and 432. For example, the slot pin guides 422 and 432 may have a long hole shape to which the first slot pin 441 or the second slot pin 451 is movably coupled.

The hinge shaft fixing holes 424 and 434 may communicate with the first hinge shaft insertion hole 443 and the second hinge shaft insertion hole 453. For example, the hinge shaft fixing holes 424 or 434 may be provided in a pair so as to form a vacant space therebetween.

The hinge shaft fixing holes 424 and 434 allow the above-described first hinge link 440 and second hinge link 450 to be movably coupled to the hinge brackets 420 and 430.

For this purpose, the folding hinge unit 400 may further include a pair of the hinge shafts 425 and 435 coupled to the first hinge shaft insertion hole 443 and first hinge shaft fixing hole 424 and the second hinge shaft insertion hole 453 and second hinge shaft fixing hole 434. The hinge shafts 425 and 435 may be referred to as hinge shaft pins or bracket pins.

The coupling holes 427 and 437 for coupling with the first frame 200 and the second frame 300 may be formed on the hinge brackets 420 and 430. For example, the coupling holes 427 and 437 may be a plurality of bolt holes formed on the upper surfaces of the hinge brackets 420 and 430, without being limited thereto, and be variously modified.

Figure 11A:
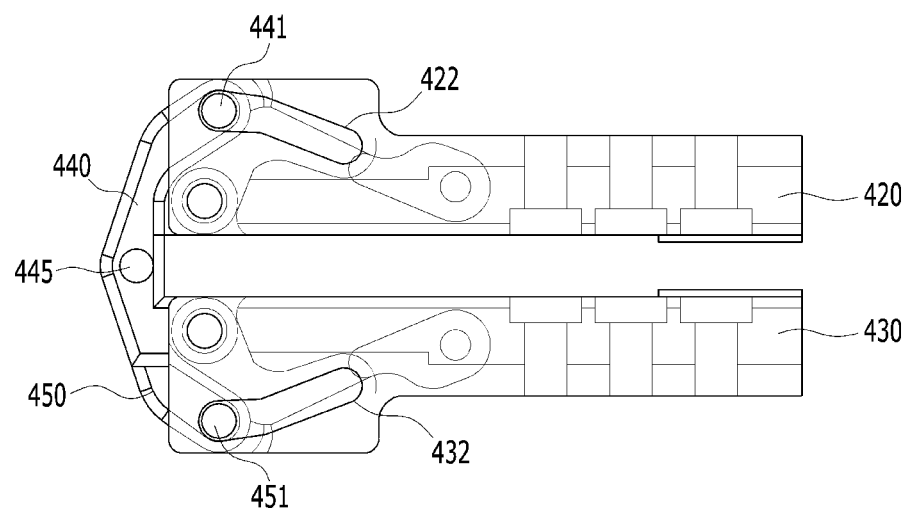
Figure 11B:
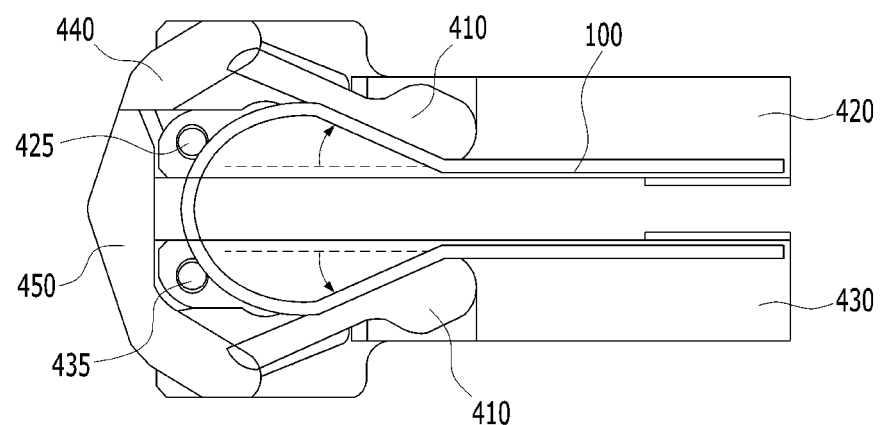

The above-described first hinge link 440 and second hinge link 450 may be exposed to the outside of the first frame 200 and the second frame 300 during the folding operation of the folding hinge unit 400, as exemplarily shown in FIGS. 11A and 11B. Therefore, the folding hinge unit 400 may further include a cover member 401 (with reference to FIG. 2) which surrounds the outer surfaces of the first hinge link 440 and the second hinge link 450.

The display device 101 including the above-described elements in accordance with one embodiment of the present invention may be operated by the folding hinge unit 400 as follows.

Figure 12:
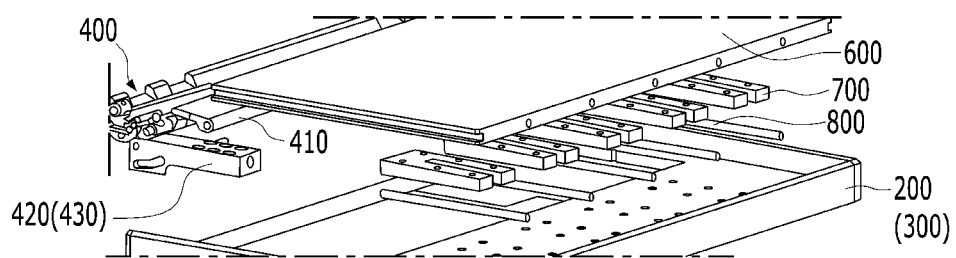
FIGS. 12 and 13 are views illustrating operation of the display device in accordance with the present disclosure.
Figure 13:
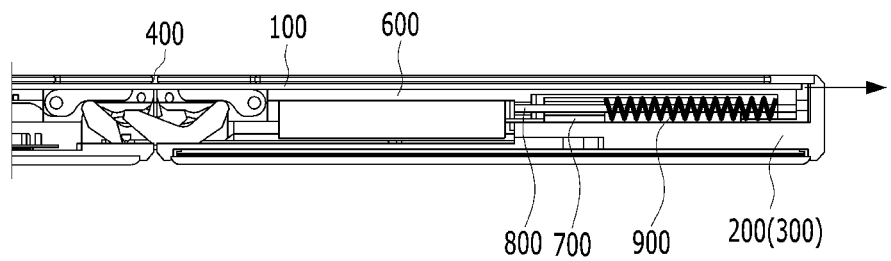

FIGS. 10A and 10B and FIGS. 11A and 11B are views illustrating operation of the folding hinge unit, as viewed from the outward direction and the inward direction thereof, respectively, and FIGS. 12 and 13 are views illustrating operation of the display device in accordance with the present invention.

Figure 10A:
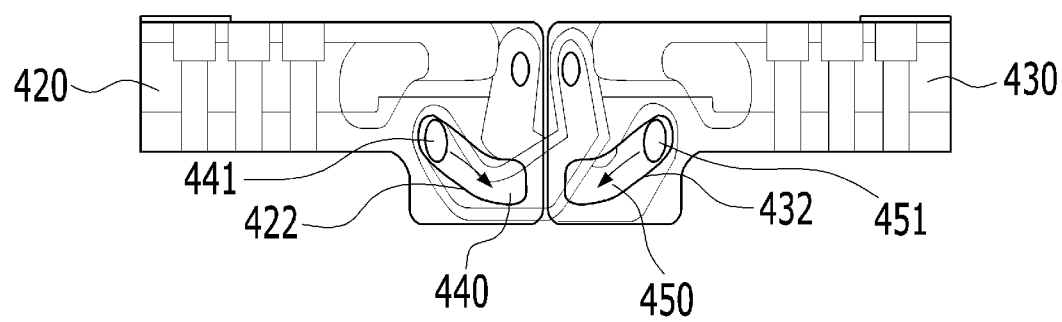
FIGS. 10A and 10B and FIGS. 11A and 11B are views illustrating operation of the folding hinge unit, as viewed from the outward direction and the inward direction thereof, respectively in accordance with one embodiment of the present disclosure.
Figure 10B:
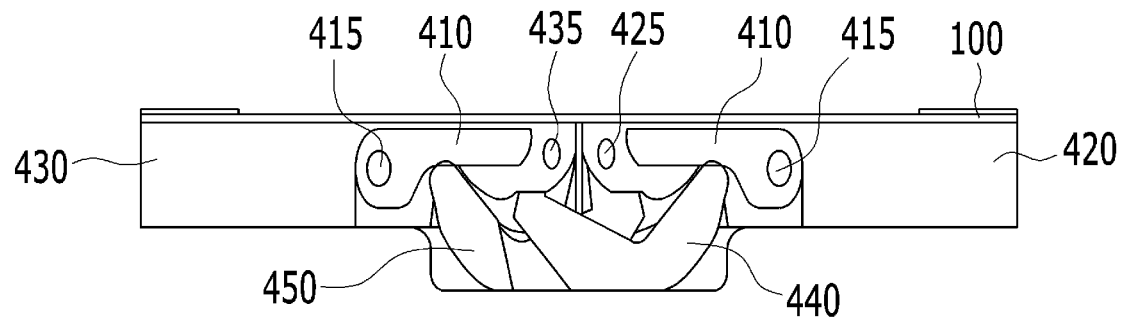

Referring to FIGS. 10A and 10B, when the panel support plates 410 of the folding hinge unit 400 are located in a parallel state, the first hinge link 440 and the second hinge link 450 located under the panel support plates 410 may be fixed to the hinge brackets 420 and 430 spread in parallel under the condition that each of the first slot pins 441 and the second slot pins 451 are located at one side edge of each of the corresponding slot pin guides 422 and 432.

Further, referring to FIGS. 12 and 13, compressive force of springs 900 connected to the spring shafts 800, and located between tension blocks 700 fixed to the insides of the first frame 200 and the second frame 300 and slide plates 600 continuously pushes the slide plates 600, and may thus apply tension to the panel 100. Therefore, the panel 100 in the parallel state is supported by the panel support plates 410 and provides a solid structure in which the folding section of the panel 100 is completely closed, thus securing sufficient durability to external load. Further, during the unfolding operation, deformation of the panel 100 is rapidly repaired, and thus, waviness of the surface of the panel 100 may be improved.

Referring to FIGS. 11A and 11B, when the first frame 200 and the second frame 300 connected to the hinge brackets 420 and 430 are folded by the folding hinge unit 400 so that the panel 100 is located on the inner surfaces of the first frame 200 and the second frame 300, the panel 100 may be bent to generate the bending area and the hinge brackets 420 and 430 may be located opposite to each other.

Here, the positions of the first hinge link 440 and the second hinge link 450 may be changed centering around the central axis of folding. That is, during the folding operation, each of the first slot pins 441 and the second slot pins 451 of the first hinge link 440 and the second hinge link 450 is gradually moved from one side edge to the other side edge of each of the corresponding slot pin guides 422 and 432 of the hinge brackets 420 and 430, and the first sliding protrusions 446 and the second sliding protrusions 456 of the first hinge link 440 and the second hinge link 450 gradually eccentrically rotate the panel support plates 410.

Therefore, the panel support plates 410 are eccentrically moved about the support plate rotating pins 415 and press the panel 100 to form the bending area, and the folding may be completed under the condition that each of the first slot pins 441 and the second slot pins 451 is located at the other side edge of each of the corresponding slot pin guides 422 and 432 of the hinge brackets 420 and 430.

The display device 101 in accordance with this embodiment, as exemplarily shown in FIG. 11B illustrating a state in which folding of the first frame 200 and second frame 300 is completed, a sufficient vacant space is formed in the bending area located between the panel support plates 410, and thus, a sufficient space, in which the panel 100 may be bent, may be secured. That is, the panel support plates 410 are moved by a folding rotation angle according to operation of the first hinge link 440 and the second hinge link 450, and thus, support the panel 100 during unfolding and form the space therebetween during folding.

As described above, the display device in accordance with the present invention provides a solid structure which is smoothly foldable and in which a folding section is completely closed to secure sufficient durability to external load, and secures a sufficient space, in which a panel may be bent, to reduce a bezel.

The above-described display device in accordance with the present invention may be applied to various electronic equipment, such as a TV, a smartphone, a tablet PC, etc.

As apparent from the above description, a display device in accordance with the present invention provides a solid structure which is smoothly foldable through a folding hinge unit and in which a folding section is completely closed to secure sufficient durability to external load, and secures a sufficient space, in which a panel may be bent, to reduce a bezel.

It will be apparent to those skilled in the art that various modifications and variations can be made in the present invention without departing from the spirit or scope of the invention. Thus, it is intended that the present disclosure cover the modifications and variations of this invention provided they come within the scope of the appended claims and their equivalents.

What is claimed is:

1. A display device comprising: first and second frames arranged adjacent to each other; a panel arranged on inner surfaces of the first and second frames; and a folding hinge unit configured to enable the first and second frames to be folded, and connected to the first and second frames, wherein the folding hinge unit comprises: a pair of panel support plates configured to support the panel so as to enable a position of the panel to be changed, and spaced apart from each other; first and second hinge links arranged under the pair of panel support plates and coupled to each other to be movable about a central axis of folding; and, wherein the first hinge link comprises: a longitudinal member having a long bar shape extending in a longitudinal direction; a pair of transverse members extending from both ends of the longitudinal member in a transverse direction; a pair of first slot pins protruding from the both ends of the longitudinal member; a pair of first connection pin insertion holes formed in the pair of transverse members; and a pair of first hinge shaft insertion holes located at ends of the pair of transverse members; and a pair of hinge brackets configured to support the pair of panel support plates and the first and second hinge links to be movable, and respectively connected to the first frame and the second frame.

2. The display device according to claim 1, wherein: the pair of panel support plates comprise pin insertion holes formed at both side surfaces of the pair of panel support plates in a longitudinal direction; and the folding hinge unit further comprises support plate rotating pins inserted into the pin insertion holes to movably couple the pair of panel support plates to the hinge brackets.

3. The display device according to claim 2, wherein each of the pin insertion holes is located at one side edge region of each of the side surfaces of the pair of panel support plates so that the pair of panel support plates are capable of being eccentrically rotated.

4. The display device according to claim 3, wherein the pair of hinge brackets comprise rotating pin mount holes to receive the support plate rotating pins inserted thereinto.

5. The display device according to claim 1, wherein the first hinge link further comprises first sliding protrusions provided in the longitudinal direction of the longitudinal member and having a sloped shape.

6. The display device according to claim 5, wherein the second hinge link has a long plate shape extending in the longitudinal direction.

7. The display device according to claim 6, wherein the second hinge link comprises: a pair of second slot pins protruding from outer ends of both side surface parts of the second hinge link; a pair of second connection pin insertion holes formed on the side surface parts of the second hinge link and configured to communicate with the pair of first connection pin insertion holes; and a pair of second hinge shaft insertion holes located at inner ends of the side surface parts of the second hinge links.

8. The display device according to claim 7, wherein the second hinge link further comprises second sliding protrusions provided in the longitudinal direction and having a sloped shape.

9. The display device according to claim 8, wherein the pair of panel support plates respectively contact the first sliding protrusions of the first hinge link and second sliding protrusions of the second hinge link.

10. The display device according to claim 8, wherein the folding hinge unit further comprises a pair of link connection pins inserted into the first and second connection pin insertion holes to form the central axis of folding, and configured to rotatably couple the first and second hinge links to each other.

11. The display device according to claim 10, wherein the pair of hinge brackets comprise: a pair of rotating pin mount holes configured to receive support plate rotating pins; a pair of slot pin guides configured to receive the first and second slot pins inserted thereinto so as to be movable; and a pair of hinge shaft fixing holes configured to communicate with the first and second hinge shaft insertion holes.

12. The display device according to claim 11, wherein the folding hinge unit further comprises a pair of hinge shafts coupled to the first and second hinge shaft insertion holes and the hinge shaft fixing holes.

13. The display device according to claim 12, wherein the pair of slot pin guides have a long hole shape to which the first slot pin and the second slot pins are movably connected.

14. The display device according to claim 13, wherein the pair of hinge brackets further comprise: coupling holes coupled to the first frame and the second frame.

15. The display device according to claim 1, wherein the folding hinge unit further comprises a cover member configured to cover the first hinge link and the second hinge link.

* * * * *